United States Patent
Kikugawa et al.

(10) Patent No.: US 7,491,475 B2
(45) Date of Patent: Feb. 17, 2009

(54) PHOTOMASK SUBSTRATE MADE OF SYNTHETIC QUARTZ GLASS AND PHOTOMASK

(75) Inventors: Shinya Kikugawa, Chiyoda-ku (JP); Keigo Hino, Takasago (JP); Hitoshi Mishiro, Takasago (JP)

(73) Assignee: Asahi Glass Company, Limited, Tokyo (JP)

( * ) Notice: Subject to any disclaimer, the term of this patent is extended or adjusted under 35 U.S.C. 154(b) by 408 days.

(21) Appl. No.: 11/478,612

(22) Filed: Jul. 3, 2006

(65) Prior Publication Data

US 2006/0246363 A1    Nov. 2, 2006

Related U.S. Application Data

(63) Continuation of application No. PCT/JP2005/004262, filed on Mar. 4, 2005.

(30) Foreign Application Priority Data

Mar. 9, 2004    (JP) .............................. 2004-065646

(51) Int. Cl.
    *G03F 1/00*    (2006.01)
(52) U.S. Cl. ......................................................... 430/5
(58) Field of Classification Search ...................... 430/5; 428/428, 430; 501/54; 378/35; 65/17.4; 359/350
    See application file for complete search history.

(56) References Cited

U.S. PATENT DOCUMENTS

| 6,143,676 | A | 11/2000 | Ohashi et al. |
| 6,319,634 | B1 | 11/2001 | Berkey et al. |
| 6,333,284 | B1 * | 12/2001 | Otsuka et al. ................. 501/54 |

FOREIGN PATENT DOCUMENTS

| EP | 1 067 096 | 1/2001 |
| EP | 1 219 571 | 7/2002 |
| JP | 2001-302275 | 10/2001 |
| JP | 2003-515192 | 4/2003 |
| WO | 02/069054 | 9/2002 |

OTHER PUBLICATIONS

U.S. Appl. No. 11/836,304, filed Aug. 9, 2007, Kikugawa et al.

* cited by examiner

*Primary Examiner*—Stephen Rosasco
(74) *Attorney, Agent, or Firm*—Oblon, Spivak, McClelland, Maier & Neustadt, P.C.

(57) ABSTRACT

It is to provide a photomask substrate which has a low birefringence and with which polarized illumination can be employed or immersion exposure can be carried out.

A photomask substrate made of a synthetic quartz glass to be used for production of a semiconductor employing a light source having an exposure wavelength of at most about 200 nm, which has a birefringence of at most 1 nm/6.35 mm at the exposure wavelength, and of which the amount of decrease in light transmittance is at most 1.0% as a difference in light transmittance at a wavelength of 217 nm, between before and after irradiation with Xe excimer lamp with an illuminance of 13.2 mW/cm² for 20 minutes.

10 Claims, No Drawings

PHOTOMASK SUBSTRATE MADE OF SYNTHETIC QUARTZ GLASS AND PHOTOMASK

TECHNICAL FIELD

The present invention relates to a photomask substrate made of a synthetic quartz glass to be used for an optical device employing a light having a wavelength of from 150 to 200 nm as a light source and a photomask. More particularly, it relates to a photomask substrate made of a synthetic quartz glass to be used as a photomask in an optical device employing an ArF excimer laser (wavelength 193 nm), a $F_2$ laser (wavelength 157 nm) or the like as a light source.

BACKGROUND ART

In production of a semiconductor integrated circuit, an exposure apparatus has been widely utilized which transfers a fine circuit pattern drawn on a mask original plate on a wafer. Along with high integration and high functionality of an integrated circuit, an integrated circuit becomes finer. Thus, an exposure apparatus is required to form an image of a circuit pattern with high resolution on a wafer with a long focal depth, and shortening of the wavelength of the exposure light source is being advanced. The exposure light source has been shifted from conventional g-line (wavelength: 436 nm) or i-line (wavelength: 365 nm), to a KrF excimer laser (wavelength: 248 nm) or an ArF excimer laser (wavelength: 193 nm).

A synthetic quartz glass is excellent in transparency to light over a wide range from a near infrared region to an ultraviolet region, it has an extremely small thermal expansion coefficient and it is relatively readily processed. From such reasons, a synthetic quartz glass has been mainly employed as a photomask substrate for an exposure apparatus employing a light having a wavelength of from 170 to 400 nm as a light source.

A photomask substrate which is practically used at present may be one for an ArF excimer laser. As its specifications, it is resistant to an ArF excimer laser and in addition, approximately, the flatness on the surface is 0.5 μm on the entire photomask face, the degree of parallelization is at a level of 5 μm, and the birefringence is at a level of from 4 to 10 nm/cm.

JP-A-2003-515192 and JP-A-2001-302275 disclose a photomask which brings about a birefringence of at most 2 nm/cm.

DISCLOSURE OF THE INVENTION

In recent years, it has been proposed to carry out immersion exposure or to employ polarized illumination by using an ArF excimer laser or a $F_2$ laser. In such a case, a conventional photomask substrate is not sufficient. One problem is birefringence and the other problem is durability. It is an object of the present invention to provide a photomask suitable when polarized illumination is employed or immersion exposure is carried out.

To overcome the above problems, the present invention provides a photomask substrate made of a synthetic quartz glass to be used for production of a semiconductor employing a light source having an exposure wavelength of at most about 200 nm, which has a birefringence of at most 1 nm/6.35 mm at the exposure wavelength, and of which the amount of decrease in light transmittance is at most 1.0% as a difference in light transmittance at a wavelength of 217 nm, between before and after irradiation with Xe excimer lamp with an illuminance of 13.2 mW/cm² for 20 minutes.

Further, the present invention provides the above photomask substrate made of a synthetic quartz glass, wherein the synthetic quartz glass has a halogen content of at most 10 ppm.

Further, the present invention provides the above photomask substrate made of a synthetic quartz glass, wherein the synthetic quartz glass has a content of halogen except fluorine of at most 10 ppm.

Further, the present invention provides the above photomask substrate made of a synthetic quartz glass, wherein the synthetic quartz glass has a OH group content of at most 100 ppm.

Further, the present invention provides the above photomask substrate made of a synthetic quartz glass, which has a flatness of at most 0.25 μm on a face on which a pattern is to be formed, a flatness of at most 1 μm on the other face, and has a degree of parallelization of at most 5 μm on both faces.

Further, the present invention provides the above photomask substrate made of a synthetic quartz glass, wherein the number of fixed defects with a size of at least 150 nm on a face on which a pattern is to be formed, is at most 10 defects/plate.

Still further, the present invention provides the above photomask substrate made of a synthetic quartz glass, which has a surface roughness of at most 0.3 nmRMS on a face on which a pattern is to be formed.

The optical member made of a synthetic quartz glass of the present invention has low birefringence. Accordingly, it is suitable as a photomask substrate with which polarized illumination is employed or immersion exposure is carried out.

BEST MODE FOR CARRYING OUT THE INVENTION

In the present invention, the photomask substrate has a birefringence of at most 1 nm/6.35 mm at the exposure wavelength, whereby a photomask substrate with which polarized illumination can be employed, or immersion exposure can be carried out, can be obtained.

For that purpose, it is preferred to suppress the Na concentration in the synthetic quartz glass constituting the photomask substrate. It is effective to bring the Na concentration in the synthetic quartz glass to at most 5 ppb, and the Na concentration is particularly preferably at most 3 ppb. Further, in order to suppress the change in the birefringence in a region of light used, it is effective to bring the difference between the maximum and the minimum of the Na concentration in that region to at most 3 ppb. In the present invention, "maximum" and "minimum" of the Na concentration mean the maximum and the minimum among Na concentrations measured at the respective points in the region of light used.

Further, in order to suppress birefringence of the synthetic quartz glass constituting the photomask substrate of the present invention and to use it as an optical member, it is preferred to optionally carry out a heat treatment such as homogenization, molding or annealing (hereinafter referred to as an optical heat treatment) to impart optical characteristics required as an optical member. The optical heat treatment is carried out after a dense and transparent synthetic quartz glass is obtained.

Among such optical heat treatments, an annealing treatment has a close relationship with birefringence of the obtained synthetic quartz glass. Accordingly, it is preferred to carry out annealing from 1,250° C. to 1,000° C. at a cooling rate of at most 5° C./hr, preferably 3° C./hr, so as to obtain a birefringence of at most 1 nm.

In order to achieve adaptability to photolithography required for an optical member to be used particularly for a catadioptric exposure apparatus, in addition to a dioptric exposure apparatus, the photomask substrate of the present invention is required to have a birefringence of at most 2 nm, and its birefringence is preferably at most 1.5 nm, particularly preferably at most 1 nm.

Further, in order to satisfy durability as a photomask substrate, of the photomask substrate of the present invention, the amount of decrease in light transmittance is at most 1.0%, as a difference in light transmittance at a wavelength of 217 nm, between before and after irradiation with a Xe excimer lamp with an illuminance of 13.2 mW/cm² for 20 minutes.

In order to obtain a photomask substrate having such high durability, the following is preferred. Namely, the decrease in the transmittance and the change in the refractive index upon the ultraviolet light irradiation can sufficiently be suppressed when substantially no oxygen excess defects nor dissolved oxygen molecules are contained in the synthetic quartz glass. "Substantially no oxygen excess defects nor dissolved oxygen molecules are contained in the synthetic quartz glass" means concentrations as measured by the following detection methods are at most the limits of defection.

The concentration of the dissolved oxygen molecules can be measured by Raman spectroscopy in accordance with L. Skuja et. al., J. Appl. Phys., vol. 83, No. 11, p. 6106-6110 (1998). The limit of detection by this method is $1 \times 10^{17}$ molecules/cm³.

Further, the concentration of oxygen excess defects can be evaluated by the OH group concentration which increases between before and after a heat treatment at from 700 to 1,000° C. in a hydrogen gas-containing atmosphere. For example, the amount of increase in the OH group concentration between before and after subjecting a synthetic quartz glass test specimen of 10×10×100 mm to a heat treatment in an atmosphere of 100% hydrogen gas under 101 Pa at 800° C. for 100 hours, is measured by an infrared spectrophotometer in accordance with Cer. Bull., 55(5), 524, (1976). The limit of detection by this method is $1 \times 10^{16}$ groups/cm³.

When the synthetic quartz glass contains substantially no reduction type defects, the decrease in the transmittance and the change in the refractive index upon the ultraviolet light irradiation can be suppressed to adequately low levels. Here, "contains substantially no reduction type defects" means that no peak in the vicinity of 2,250 cm$^{-1}$ attributable to SiH is observed in Raman spectroscopy.

With respect to the oxygen deficient defect concentration in the synthetic quartz glass, when the concentration is at most $5 \times 10^{14}$ defects/cm³, the decrease in the transmittance upon the ultraviolet light irradiation can be adequately suppressed.

The concentration of the oxygen deficient defects in the synthetic quartz glass can be obtained from the intensity of blue photoluminescence with a peak in the vicinity of from 280 to 300 nm when irradiated with ultraviolet lights. Namely, the scattered light intensity of an ArF excimer laser beam and the peak intensity of blue photoluminescence centered in the vicinity of from 280 to 300 nm are measured by means of e.g. a fiber light guide type spectrophotometer equipped with multichannel photodiode (MCPD2000, manufactured by OTSUKA ELECTRONICS CO., LTD.). When the proportion of the peak intensity of the blue photoluminescence to the scattered light at 193 nm is at most $5 \times 10^{-3}$ and at least $1 \times 10^{-4}$, it can be judged that the concentration of the oxygen deficient defects in the synthetic quartz glass is within the above concentration range. If the intensity ratio exceeds $5 \times 10^{-3}$, the concentration of the oxygen deficient defects in the synthetic quartz glass exceeds $5 \times 10^{14}$ defects/cm³, and the transmittance upon the ultraviolet light irradiation may decrease.

Here, the relation between the intensity ratio and the oxygen deficient defect concentration was obtained by utilizing the absorption band centered at 163 nm due to the oxygen deficient defects. Namely, the oxygen deficient defect concentration was obtained by the absorption intensity at a wavelength of 163 nm in accordance with H. Hosono et. al., Phys. Rev. B44, p12043 (1991), and by measuring the blue photoluminescence intensity of a synthetic quartz glass sample the concentration of which has been known, the relation between the blue photoluminescence intensity ratio I to the scattered light at a wavelength of 193 nm and the oxygen deficient defect concentration $C_{ODC}$ (defects/cm³) was obtained as a formula (1):

$$C_{ODC} = 1.16 \times 10^{17} \times I \quad \text{Formula (1)}$$

The change in the refractive index and the decrease in the transmittance upon the ultraviolet light irradiation can be suppressed to adequately low levels when the synthetic quartz glass has a chlorine concentration of at most 10 ppm, preferably it contains substantially no chlorine. The chlorine concentration in the synthetic quartz glass can be measured by fluorescent X-ray. The limit of detection by this method is 10 ppm. If the chlorine concentration in the synthetic quartz glass exceeds the above range, the decrease in the transmittance and the change in the refractive index upon the ultraviolet light irradiation may be significant.

The change in the refractive index and the decrease in the transmittance upon the ultraviolet light irradiation can be suppressed to adequately low levels when the synthetic quartz glass has an OH group concentration of at most 100 ppm, preferably at most 50 ppm. The OH group concentration can be measured by an infrared spectrophotometer in accordance with Cer. Bull., 55 (5), 524, (1976). The limit of detection by this method is 1 ppm. If the OH group concentration in the synthetic quartz glass exceeds the above range, the decrease in the transmittance and the change in the refractive index upon the ultraviolet light irradiation may be significant.

Further, it is preferred that the synthetic quartz glass of the present invention contains hydrogen molecules within a range of from $5 \times 10^{15}$ molecules/cm³ to $1 \times 10^{19}$ molecules/cm³. The hydrogen molecules in the synthetic quartz glass have a function to repair the paramagnetic defects such as the E'center and the non-bridging oxygen radical formed by irradiation with ultraviolet lights, and have an effect to suppress the decrease in the transmittance upon the ultraviolet light irradiation.

In the present invention, metal impurities such as alkali metals (such as Na, K and Li), alkaline earth metals (such as Mg and Ca) and transition metals (such as Fe, Ni, Cr, Cu, Mo, W, Al, Ti and Ce) in the synthetic quartz glass not only decrease the light transmittance in an ultraviolet to vacuum ultraviolet region but cause deterioration of the durability to the light. Accordingly, their content is preferably as low as possible. Specifically, the total content of the metal impurities is preferably at most 100 ppb, particularly preferably at most 50 ppb.

The strained structures in the synthetic quartz glass are defects precursors of e.g. the E'center and the NBOHC to be formed by irradiation with ultraviolet lights. Accordingly the concentration is preferably low in the present invention. Specifically, the ratios of the scattering peak intensity $I_{495}$ at 495 cm$^{-1}$ and the scattering peak intensity $I_{606}$ at 606 cm$^{-1}$, to the scattering peak intensity $I_{440}$ at 440 cm$^{-1}$ in the laser Raman spectrum, $I_{495}/I_{440}$ and $I_{606}/I_{440}$ are preferably at most 0.585 and at most 0.136, respectively.

The synthetic quartz glass may contain fluorine in an amount of from 100 to 10,000 ppm. Fluorine is effective to reduce unstable structures in the synthetic quartz glass and to improve the durability to the ultraviolet light, however, if the fluorine content is less than 100 ppm, unstable structures in the synthetic quartz glass may not be reduced to a sufficient level. Further, if fluorine is contained in an amount exceeding 10,000 ppm, the reduction type defects may form, and thus the durability to the ultraviolet light may decrease.

Now, the process for producing the synthetic quartz glass of the present invention will be explained below.

The process to synthesize the synthetic quartz glass is to supply a compound containing Si as a synthesis material, oxygen gas, hydrogen gas, nitrogen gas etc. to a burner made of a quartz glass, and subject the synthesis material to hydrolysis and/or oxidation in oxyhydrogen flame to synthesis a quartz glass, and two types of methods i.e. a direct method and a VAD method (soot method, OVD method and indirect method) may be mentioned.

The direct method is a synthesis method of subjecting a compound containing Si to flame hydrolysis at a temperature of from 1,500 to 2,000° C. to synthesize $SiO_2$ particles, and depositing and fusing them on a substrate to directly synthesize a transparent synthetic quartz glass. On the other hand, the VAD method is a method of subjecting a compound containing Si to flame hydrolysis at a temperature of from 1,000 to 1,500° C. to synthesize $SiO_2$ particles and depositing them on a substrate to firstly obtain a porous synthetic quartz glass body, and then increasing the temperature to from 1,400 to 1,500° C. to densify the porous synthetic quartz glass body to obtain a transparent synthetic quartz glass body.

The VAD method is preferred as the synthesis method of the synthetic quartz glass in view of relatively low reaction temperature at the time of synthesis and with a view to relatively freely controlling the composition and the defect concentrations. Particularly, due to the low reaction temperature at the time of synthesis, the chlorine concentration in the synthetic quartz glass synthesized by using a material containing chlorine such as $SiCl_4$, is lower by the VAD method than by the direct method, and the VAD method is preferred in this viewpoint also. Further, the synthesis material of the synthetic quartz glass is not particularly limited so long as it is a material capable of being gasified, and it may, for example, be a chloride such as $SiCl_4$, $SiHCl_3$, $SiH_2Cl_2$ or $SiCH_3Cl_3$, a halogenated silicone compound such as $SiF_4$, $SiHF_3$ or $SiH_2F_2$, or a silicon compound containing no halogen such as an alkoxysilane represented by $R_nSi(OR)_{4-n}$ (wherein R is a $C_{1-4}$ alkyl group, and n is an integer of from 0 to 3) or $(CH_3)_3Si—O—Si(CH_3)_3$.

When a chloride is used as the synthesis material, chlorine in the synthesis material remains in the synthetic quartz glass. And thus preferred as the synthesis material is an organic silicon compound or a fluoride, containing no chlorine. However, if a fluoride is used as the synthesis material, hydrofluoric acid (HF) forms as a reaction by-product at the time of synthesis, such being problematic in view of safety and handling efficiency. Accordingly, as the synthesis material, an organic silicon compound containing no halogen is preferred.

In a case where the synthetic quartz glass is synthesized by the VAD method, the concentrations of the oxygen excess defects, the dissolved oxygen molecules and the oxygen deficient defects in the synthetic quartz glass can be controlled by several methods.

Specifically, (1) a method of adjusting the supply proportion of the oxygen gas and the hydrogen gas in the synthesis material gas, (2) a method of treating the porous synthetic quartz glass body by a reducing compound such as a compound containing fluorine or chlorine, or (3) a method of adjusting the conditions when the porous synthetic quartz glass body is densified to the transparent synthetic quartz glass body, may be mentioned.

The method (1) is a method of setting the ratio of the hydrogen gas to the oxygen gas in the synthesis material gas to be a value higher than the stoichiometric ratio 2, i.e. within a range of from 2.0 to 2.5 to synthesize the porous synthetic quartz glass.

The method (2) is to subject the porous synthetic quartz glass body to a heat treatment in an atmosphere which contains a compound containing fluorine or a reducing compound such as a hydrogen gas or a CO gas at a temperature of from room temperature to 1,200° C. The compound containing fluorine may, for example, be $CF_4$, $SiF_4$ or $SF_6$. When the compound containing fluorine or chlorine, or the CO gas is used, since such gases have extremely high reduction properties, it is preferred to use a mixed gas diluted to a range of from 0.01 to 10 vol %, preferably from 0.05 to 5 vol % by means of an inert gas (such as nitrogen, helium or argon). And the treatment temperature is preferably from room temperature to about 1,000° C., and the ambient pressure is preferably from 1 kPa to 101 kPa.

Further, in a case where the hydrogen gas is used, it is preferred to carry out the heat treatment with an inert gas containing a hydrogen gas in an amount of from 50 to 100 vol % under from 101 to 1,013 Pa at from 800 to 1,200° C. The porous synthetic quartz glass body is set in a reducing atmosphere, and then the gas is introduced from the above state until the pressure reaches a predetermined pressure, whereby the porous synthetic quartz glass can be treated uniformly with high efficiency.

Further, the method (3) is a method of holding the synthesized porous synthetic quartz glass body in a graphite furnace capable of adjusting the atmosphere and employing high purity carbon as a heater and as an insulating material, or a metal furnace capable of adjusting the atmosphere and employing W or Mo as a reflector and as a heater, in an atmosphere of 100 vol % inert gas such as helium or nitrogen under a reduced pressure of from 10 Pa to 10 kPa at a temperature of from 1,100 to 1,300° C., preferably from 1,200 to 1,300° C. for from 20 to 200 hours, and then increasing the temperature to from 1,400 to 1,500° C. under the same atmosphere for densification to obtain a transparent synthetic quartz glass body. The concentrations of the oxygen excess defects, the dissolved oxygen molecules and the oxygen deficient defects in the synthetic quartz glass can be controlled by carrying out one or a combination of the above-described three methods.

Further, the OH group concentration in the synthetic quartz glass can be made at most 100 ppm by carrying out the above method (2) or (3) among the above three methods.

The photomask substrate of the present invention preferably has a flatness of at most 0.25 μm on a face on which a pattern is to be formed, a flatness of at most 1 μm on the other face, and a degree of parallelization of at most 5 μm on both faces, whereby an adequate exposure precision can be secured even when polarized illumination is employed or immersion exposure is carried out.

Such a photomask substrate may be prepared, for example, by the following method.

A synthetic quartz glass plate having an outside dimension larger by at least 10 mm than the dimension of the photomask substrate is polished. Then, the synthetic quartz glass plate is cut into a predetermined dimension to prepare a photomask substrate. Then, a dummy portion to be processed is attached to the side surfaces of the synthetic quartz glass plate, and the synthetic quartz glass plate in such a state is polished to produce a photomask substrate.

Namely, a substrate larger by at least 10 mm than the outside dimension of the photomask substrate is polished and finished to a predetermined plate thickness, and then the outer peripheral portion is cut. A photomask substrate having a satisfactory amount of the change in plate thickness can be obtained in such a manner. Further, a dummy portion to be processed having the same thickness as the photomask substrate to be processed, instead of the cut margin, is provided on the side surfaces of the photomask substrate, and set to a carrier together with the photomask substrate, whereby the sagging at the outer peripheral portion of the photomask substrate will decrease.

The width of the dummy portion to be processed is preferably at least 10 mm. Further, the dummy portion to be processed is preferably made of a synthetic quartz glass so that the polishing speed is the same as that of the photomask substrate to be processed and that the photomask substrate can be prevented from being scared by cullets formed by polishing during the processing. However, it may be made of a resin which has the same properties.

When the substrate is polished, the polishing apparatus preferably has at least such a size that one substrate is accommodated in the radius of the carrier, or such a size that the entire dummy portion to be processed can be held in the radius. This is to minimize the influence by the difference in the polishing rate between the center portion and the peripheral portion of the carrier as far as possible.

Now, a specific example of the present method will be explained below. An ingot of a quartz glass material synthesized by a known method is cut into a predetermined thickness by an inner blade slicer. Then, chamfering is carried out by a commercially available NC chamfering machine into a predetermined outside dimension and into an R-shape at the edge.

Then, the synthetic quartz glass plate is immersed in a 5 mass % HF solution so as to prevent progress of cracks due to cutting and cracks due to chamfering. Then, the synthetic quartz glass plate is subjected to lapping into a predetermined thickness by using a double-sided lapping machine and an abrasive slurry.

Then, the same etching treatment as described above is applied to the synthetic quartz glass plate after lapping. Then, the synthetic quartz glass plate is polished with a slurry composed mainly of cerium oxide and a polyurethane pad by using a double-sided polishing machine. Then, finish polishing is carried out with a slurry composed mainly of cerium oxide and an expanded polyurethane pad by using the same machine, to obtain a photomask substrate having a predetermined thickness.

It is preferred that the number of fixed defects with a size of at least 150 nm on a face on which a pattern is to be formed is at most 10 defects/plate, and it is particularly preferred that there are no fixed defects with a size of at least 150 nm. The fixed defects are defects of which the positions are not changed by washing, as disclosed in JP-A-2001-50907. In order to reduce such fixed defects, it is effective to remove foreign substances having an average diameter of at least 100 nm in the slurry used for polishing, whereby the fixed defects to impair the exposure can be reduced.

It is preferred that the surface roughness on a face on which a pattern is to be formed is at most 0.3 nmRMS, whereby directivity of the pattern on the photomask can is easily be secured even when polarized illumination is employed or immersion exposure is carried out, and the above defects with a size of at least 150 nm can easily be detected by irradiation with scattered light.

In order that the surface roughness is at most 0.3 nmRMS, the following polishing method may be employed. Namely, a hard abrasive cloth having a compressibility of at most 10% and a modulus in compression of at most 90% is used, and an abrasive having an average particle size within a range of from 1 to 100 nm, having a smaller particle size than an abrasive for common polishing, is used. In such a manner, a polished surface with surface roughness and the level of scars comparable to a case where a conventional soft abrasive cloth and a cerium oxide abrasive are used, can be obtained without deterioration of the degree of parallelization.

EXAMPLES

Now, the present invention will be explained in further detail with reference to Examples. However, the present invention is by no means restricted thereto.

Example 1

By a known soot method, $SiCl_4$ is subjected to hydrolysis in oxyhydrogen flame, the formed $SiO_2$ fine particles are deposited on a substrate to prepare a cylindrical porous quartz glass body having a diameter of 35 cm and a height of 100 cm. Further, the porous quartz glass body is set in an electric furnace capable of adjusting the atmosphere and left to stand at room temperature under a pressure of $1.013 \times 10^5$ Pa in atmosphere of $SiF_4/He=10/90$ to carry out a fluorine doping treatment. Then, the porous quartz glass body is heated to 1,450° C. while maintaining a reduced pressure of at most 10 Pa and held at this temperature for 10 hours to prepare a transparent synthetic quartz glass body.

The transparent glass body is put in a high temperature heating furnace equipped with a graphite heater and heated to 1,750° C. so that it undergoes deformation by its own weight, and molded into a block of 17×17×25 cm. After completion of the molding, the block is annealed to carry out annealing. The cooling rate during annealing from 1,300° C. to 1,000° C. is adjusted to 3° C./hr.

A plate of 153 mm square×6.4 mm in thickness is cut out from the obtained block. The obtained plate is set in an electric furnace capable of adjusting the atmosphere and subjected to a hydrogen doping treatment in an atmosphere of 10 to 100% hydrogen under from 101 to 1,013 Pa at 500° C. Then, the hydrogen doped plate is polished to prepare a photomask substrate. With respect to the photomask substrate, the birefringence, the F concentration and the $H_2$ concentration, and the durability to Xe excimer lamp are measured in accordance with methods as described hereinafter.

Example 2

By a known soot method, $SiCl_4$ is subjected to hydrolysis in oxyhydrogen flame, the formed $SiO_2$ fine particles are deposited on a substrate to prepare a cylindrical porous quartz glass body having a diameter of 35 cm and a height of 100 cm. Further, the porous quartz glass body is sintered in an electric furnace at 1,450° C. to prepare a transparent glass body.

The transparent glass body is put in a high temperature heating furnace equipped with a graphite heater and heated to 1,750° C. so that it undergoes deformation by its own weight, and molded into a block of 17×17×25 cm. After completion of the molding, the block is annealed to carry out annealing. The cooling rate during annealing from 1,300° C. to 1,000° C. is adjusted to 3° C./hr.

A plate of 153 mm square×6.4 mm in thickness is cut out from the obtained block. The obtained plate is set in an electric furnace capable of adjusting the atmosphere and subjected to a hydrogen doping treatment in an atmosphere of 10 to 100% hydrogen under from 101 to 1,013 Pa at 500° C. Then, the hydrogen doped plate is polished to prepare a photomask substrate. With respect to the photomask substrate, the birefringence, the F concentration and the $H_2$ concentration, and the durability to Xe excimer lamp are measured in accordance with methods as described hereinafter.

(Evaluation)

(Evaluation Method 1: Birefringence)

Using EXICOR manufactured by Hinds Instruments Inc. employing a He—Ne laser as a light source, the birefringence is measured with respect to 121 points selected from rectangles 14.2 mm square in a face of 142 mm×142 mm at the center portion of the photomask substrate, and the maximum is obtained. It is 0.86 nm/6.35 mm in Example 1 and it is 0.92 nm/6.35 mm in Example 2.

(Evaluation Method 2: F Concentration)

A sample of 15 mm×15 mm×6.3 mm is cut out from the center portion of the photomask substrate, and the fluorine concentration is measured in accordance with the following method.

In accordance with the method as disclosed in Nippon Kagakukaishi (published by the Chemical Society of Japan, 1972 (2), p. 350), the sample is melted by heating by anhydrous sodium carbonate, and distilled water and hydrochloric acid (volume ratio 1:1) are added to the obtained melt to prepare a sample liquid. The electromotive force of the sample liquid is measured by means of a radiometer employing as a fluorine ion selective electrode and as a comparative electrode No. 945-220 and No. 945-468 manufactured by Radiometer Trading K.K., respectively. Then, the fluorine concentration is obtained based on an analytical curve preliminarily prepared by using a fluorine ion standard solution. The limit of detection by this method is 10 ppm. It is 389 ppm in Example 1 and it is at most the limit of detection in Example 2.

(Evaluation Method 4: Hydrogen Molecule Concentration)

Raman spectrometry is carried out, and the hydrogen molecule concentration (molecules/cm$^3$) is obtained from the intensity ratio ($I_{4135}/I_{800}$) of the intensity $I_{4135}$ of the scattering peak at 4,135 cm$^{-1}$ in the laser Raman spectrum to the intensity $I_{800}$ of the scattering peak at 800 cm$^{-1}$ representing the fundamental vibration between silicon and oxygen (V. S. Khotimchenko, et. al., Zhurnal Prikladnoi Spektroskopii, Vol. 46, pp. 987-997, 1986).

The limit of detection by this method is 1×10$^{16}$ molecules/cm$^3$. It is 2.9×10$^{18}$ molecules/cm$^3$ in Example 1 and it is less than 5×10$^{16}$ molecules/cm$^3$ in Example 2.

(Evaluation Method 5: Adaptability to Lithography Light Source)

The amount of decrease in light transmittance is measured and evaluated, as a difference in light transmittance at a wavelength of 217 nm, between before and after irradiation with Xe excimer lamp with an illuminance of 13.2 mW/cm$^2$ for 20 minutes. It is 0.092% in Example 2.

The chlorine concentration is at most 10 ppm in each Example.

INDUSTRIAL APPLICABILITY

The optical member made of a synthetic quartz glass of the present invention has low birefringence, and is suitable as a photomask substrate with which polarized illumination can be employed or immersion exposure can be carried out.

The entire disclosure of Japanese Patent Application No. 2004-065646 filed on Mar. 9, 2004 including specification, claims and summary is incorporated herein by reference in its entirety.

What is claimed is:

1. A photomask substrate made of a synthetic quartz glass to be used for production of a semiconductor employing a light source having an exposure wavelength of at most about 200 nm, which has a birefringence of at most 1 nm/6.35 mm at the exposure wavelength, and of which the amount of decrease in light transmittance is at most 1.0% as a difference in light transmittance at a wavelength of 217 nm, between before and after irradiation with Xe excimer lamp with an illuminance of 13.2 mW/cm$^2$ for 20 minutes.

2. The photomask substrate made of a synthetic quartz glass according to claim 1, wherein the synthetic quartz glass has a halogen content of at most 10 ppm.

3. The photomask substrate made of a synthetic quartz glass according to claim 1, wherein the synthetic quartz glass has a content of halogen except fluorine of at most 10 ppm.

4. The photomask substrate made of a synthetic quartz glass according to claim 1, wherein the synthetic quartz glass has a OH group content of at most 100 ppm.

5. The photomask substrate made of a synthetic quartz glass according to claim 1, which has a flatness of at most 0.25 µm on a face on which a pattern is to be formed, a flatness of at most 1 µm on the other face, and has a degree of parallelization of at most 5 µm on both faces.

6. The photomask substrate made of a synthetic quartz glass according to claim 1, wherein the number of fixed defects with a size of at least 150 nm on a face on which a pattern is to be formed, is at most 10 defects/plate.

7. The photomask substrate made of a synthetic quartz glass according to claim 1, which has a surface roughness of at most 0.3 nmRms on a face on which a pattern is to be formed.

8. A photomask for immersion exposure with an ArF excimer laser light, which employs the photomask substrate made of a synthetic quartz glass as defined in claim 1.

9. A photomask for exposure by polarized illumination with an ArF excimer laser light, which employs the photomask substrate made of a synthetic quartz glass as defined in claim 1.

10. A photomask for immersion exposure with a $F_2$ excimer laser light, which employs the photomask substrate made of a synthetic quartz glass as defined in claim 1.

* * * * *